US012782432B2

(12) United States Patent
Hartl

(10) Patent No.: US 12,782,432 B2
(45) Date of Patent: Nov. 3, 2026

(54) MODULE FOR EXCHANGING AN INTERFACE UNIT, TESTING SYSTEM WITH SUCH A MODULE, METHOD FOR TESTING SEMICONDUCTOR ELEMENTS AND FOR EXCHANGING INTERFACE UNITS

(71) Applicant: Turbodynamics GmbH, Stephanskirchen (DE)

(72) Inventor: Florian Hartl, Stephanskirchen (DE)

(73) Assignee: Turbodynamics GmbH, Stephanskirchen (DE)

( * ) Notice: Subject to any disclaimer, the term of this patent is extended or adjusted under 35 U.S.C. 154(b) by 157 days.

(21) Appl. No.: 18/942,932

(22) Filed: Nov. 11, 2024

(65) Prior Publication Data

US 2025/0155497 A1 May 15, 2025

(30) Foreign Application Priority Data

Nov. 13, 2023 (DE) ..................... 10 2023 131 522.6

(51) Int. Cl.
*G01R 31/28* (2006.01)
*G01R 31/26* (2020.01)

(52) U.S. Cl.
CPC ..... *G01R 31/2893* (2013.01); *G01R 31/2601* (2013.01)

(58) Field of Classification Search
CPC ............ G01R 31/2893; G01R 31/2601; G01R 31/2887; G01R 31/2886; G01R 31/26;
(Continued)

(56) References Cited

U.S. PATENT DOCUMENTS 6,471,462 B1 * 10/2002 Lee .................... G01R 31/2808 414/416.01
6,870,362 B2 3/2005 Thurmaier
(Continued)

FOREIGN PATENT DOCUMENTS

DE 10216003 B4 3/2005
DE 102012103893 A1 11/2013
(Continued)

OTHER PUBLICATIONS

Unpublished German Patent Application No. 10 2022 130 631.3, filed Nov. 18, 2022. 58 pages.
(Continued)

*Primary Examiner* — Alvaro E Fortich
(74) *Attorney, Agent, or Firm* — HoustonHogle LLP

(57) ABSTRACT

The invention relates to a module for replacing an interface unit in a testing system with a handling unit and a testing unit for testing semiconductor elements. The module has a basis element, which is or can be attached to the testing system, and a drawer unit with a holding frame for holding an interface unit. Furthermore, the module comprises guide elements that connect the drawer unit to the basis element and are designed to guide the drawer unit relative to the basis element between an insertion position. The module is characterized in that the basis element has a docking element which comprises a counter-docking unit and is arranged adjacent to the holding frame in the removal position of the drawer unit.

15 Claims, 5 Drawing Sheets

(58) Field of Classification Search
CPC .............. G01R 31/2851; G01R 31/282; G01R 31/2829; G01R 31/2831; B65G 1/0485; B65G 1/06; B65G 1/1373; B65G 2201/025; B65G 2201/0258; G01N 2035/0465; G01N 35/00732; G01N 35/04
See application file for complete search history.

(56) References Cited

U.S. PATENT DOCUMENTS

| | | | | |
|---|---|---|---|---|
| 11,493,554 | B2 | 11/2022 | Thurmaier | |
| 2015/0123685 | A1* | 5/2015 | Thurmaier | G01R 31/2889 324/750.25 |
| 2015/0331042 | A1* | 11/2015 | Thurmaier | G01R 31/2887 324/750.25 |
| 2016/0202311 | A1* | 7/2016 | Thurmaier | G01R 31/2889 324/750.16 |
| 2022/0390508 | A1* | 12/2022 | Thurmaier | G01R 31/2887 |
| 2024/0168087 | A1 | 5/2024 | Thurmaier | |

FOREIGN PATENT DOCUMENTS

| | | | |
|---|---|---|---|
| DE | 102020104641 | A1 | 8/2021 |
| DE | 102021114564 | A1 | 12/2022 |
| EP | 3220413 | A1 | 9/2017 |
| WO | WO 2013/164407 | A1 | 11/2013 |

OTHER PUBLICATIONS

German Research Report, mailed on Jul. 26, 2024, from German application No. 10 2023 131 522.6 filed on Nov. 13, 2023. 10 pages.

* cited by examiner

MODULE FOR EXCHANGING AN INTERFACE UNIT, TESTING SYSTEM WITH SUCH A MODULE, METHOD FOR TESTING SEMICONDUCTOR ELEMENTS AND FOR EXCHANGING INTERFACE UNITS

RELATED APPLICATIONS

This application claims priority to German Patent Application No. 10 2023 131 522.6, filed on Nov. 13, 2023, which is incorporated herein by reference in its entirety.

BACKGROUND OF THE INVENTION

Test systems for testing semiconductor elements usually comprise a testing unit ("tester") and a handling unit ("handler" or "prober"). The testing unit comprises a test head, with which the semiconductor elements to be tested are contacted, and evaluation electronics. The handling unit comprises elements with which the semiconductor elements to be tested are fed to the testing unit one after the other. So that different semiconductor elements can be tested with such a testing system, there is an interface unit which is arranged in the area of the interface between the testing unit and the handling unit and has contact elements for contacting the electrical semiconductor elements to be tested on the one hand and for contacting the test head on the other. Depending on the testing system, this interface unit can be attached to either the testing unit or the handling unit. In operation, the testing unit is firmly coupled to the handling unit, with the interface unit fixed in between. This state is referred to as the test position. The interface unit is contacted by the test head of the testing unit. The interface unit is loaded with a semiconductor element by the handling unit by contacting corresponding contact elements, which can then be tested by the testing unit.

The term semiconductor elements includes semiconductor components and wafers. A handling unit for feeding individual integrated circuits is referred to in the trade as a "handler" and a handling unit for feeding wafers (wafer slices) is referred to as a "prober". In a testing system for testing wafers, the wafer slices are usually fed from below, so that the handling unit is arranged below the testing unit. The arrangement can therefore be rotated by 180°.

For testing semiconductor components, the interface unit usually has a base frame, an interface board (contacting board) and a stiffener, which are firmly, but possibly detachably, connected to each other. The interface board has contact elements for contacting corresponding contact points on the semiconductor components as well as contacting patterns for contacting corresponding contact units of the testing unit. The contact elements are each arranged in a pattern specific to the semiconductor components to be tested in order to be able to contact the contact points of the semiconductor components correctly, and are often designed as spring contacts. The contacting patterns are also arranged in a specific pattern in order to be able to contact the contact units of the testing unit correctly and are connected to the contact elements via conductor tracks or other connecting elements. The base frame is designed to hold one or more semiconductor components and is provided with corresponding holding elements, such as alignment or centering elements and stop or support elements, in order to precisely position the semiconductor components in a clearly defined position relative to the interface board. The stiffener is designed to absorb compressive loads when the interface board is fitted with semiconductor components.

Different interface units are available for testing different semiconductor elements. The interface unit must therefore be replaced if a different type of semiconductor element is to be tested.

DE 10 2012 103 893 A1 (WO 2013/164407 A1), for example, discloses a testing system for testing semiconductor elements with a module for replacing an approximately flat interface unit. The module comprises a base element which can be attached to the testing system, a holder for holding an interface unit and guide elements with which the holder is attached to the base element in such a way that the holder can be moved between an end position on the base element and a removal position. In the end position, the interface unit is located in an interface plane. The guide elements comprise at least one link-guided lever mechanism, which is designed at least for guiding a rectilinear translational movement of the holder in a direction perpendicular to the interface plane starting from the end position. Furthermore, the guide elements comprise a drawer mechanism which is designed to guide a rectilinear translational movement of the holder in or parallel to the interface plane. Instead of directly attaching the interface unit to the testing unit or the handling unit, the module is attached to the testing unit or the handling unit with its basis element. The guide elements can be used to move the interface unit between a test position, in which the interface unit for testing semiconductor elements is arranged between a testing unit and a handling unit of the test system, and a removal position, in which the interface unit is arranged outside the area between the testing unit and the handling unit.

When the interface unit is loaded with semiconductor components by the handling unit, this is effected under comparatively high pressure, as the contact elements of the interface board are usually designed as spring contacts and are often present in large numbers. The spring forces of the contact elements must be reliably overcome in order to securely position and hold the semiconductor components. For this reason, the semiconductor components are pressed on under high pressure (so-called plunging). If the interface unit is also designed to hold several semiconductor components, the contact forces acting on the interface unit accumulate. In total, forces of several 100 to several 1000 or even several 10,000 N can occur. These forces are transferred to the guide elements, which guide and, if necessary, move the holder relative to the handling unit or testing unit for replacing the interface unit and hold it in the test position during the test process. High forces can therefore act on the guide elements. These must therefore be designed to be very robust, as even slight wear can impair the accuracy of the positioning of the interface unit and holding forces can penetrate drive elements of the replacement module or the test head.

DE 10 216 003 B4 (U.S. Pat. No. 6,870,362 B2) relates to a docking device for coupling a first device consisting of a handler or prober and a second device consisting of a test head for electronic components, wherein at least one locking unit is provided which has an axial insertion opening for inserting a locking pin. A plurality of balls is arranged in the region of the insertion opening, between which the locking pin can be inserted. Furthermore, a ball clamping sleeve is provided which causes a radial movement of the balls inwards by axial displacement so that the balls can engage in a circumferential groove of the locking pin and thus secure it. The axial displacement can be triggered by a rotatable threaded sleeve, the internal thread of which meshes with an external thread of the ball clamping sleeve, which is mounted in a rotationally fixed but axially displaceable manner. The rotation of the threaded sleeve can be controlled via a cable pull.

EP 3 220 413 A1 describes a service device for lifting and moving components of a system for processing semiconductor components. This device is intended to replace mobile service cranes for handling corresponding components. The service device is permanently or temporarily integrated into a corresponding machine. It comprises a carrier and an arm with a device for lifting a component.

DE 10 2022 130 631.3, which has not yet been published, discloses a further testing system for testing semiconductor elements with a module for exchanging an approximately planar interface unit. This document also discloses a locking device in the form of docking elements, which is provided by the module and by means of which the interface unit can be fixed to a handling unit or testing unit of the test system before the handling unit and the testing unit are moved together. For this purpose, the module has a basis element that is attached to either the handling unit or the testing unit. The module also includes a holder in which the interface unit is arranged. By means of guide elements, the holder can be moved into an area between the handling unit and the testing unit and an area outside the test system in order to be able to exchange interface units. The holder with interface unit can be coupled to the basis element, whereby the holder with interface unit is then located between the handling unit and the testing unit.

In addition, trolleys for transporting (handling) interface units are known, with which interface units can be automatically exchanged between a testing system and a storage device for a plurality of interface units. Such trolleys usually have a handling part for holding an interface unit and a trolley on which the handling part is arranged. The chassis is often an AGV (automated guided vehicle) or an AMR (autonomous mobile robot).

DE 10 2020 104 641 A1 (U.S. Pat. No. 11,493,554 B2), for example, discloses such a trolley, a storage device and a disposition system for automatically managing interface units. The trolley can be used to transport interface units back and forth between a storage device and a testing system for testing semiconductor elements. The trolley is a self-propelled vehicle that has docking elements with which the trolley can be coupled to both the storage device and a testing system.

In DE 10 2021 114 564 A1 (US 2022/390508 A1), another trolley is shown which has docking elements that can contract independently, whereby the docking elements arranged on the trolley are automatically aligned axially with corresponding opposite docking elements. By using two such docking elements and opposite docking elements, a correspondingly coupled trolley is clearly defined in space in relation to the corresponding counter device. The counter device can be a testing system for testing semiconductor elements.

SUMMARY OF THE INVENTION

The invention relates to a module for exchanging an interface unit in a testing system for testing semiconductor elements and to a testing system with such a module. The invention also relates to a method for testing semiconductor elements and for exchanging interface units.

The task of the present invention is to create a module for replacing an interface unit in a testing system, on which interface units can be replaced safely and reliably.

A further task of the present invention is to create a module for replacing an interface unit in a testing system, on which interface units can be replaced easily, safely and reliably in an automatic manner.

A further task of the present invention is to create a module for replacing an interface unit in a testing system, with which particularly heavy interface units can be replaced safely and reliably.

One or more of the tasks are solved by a module for exchanging an interface unit in a testing system, as defined in independent patent claim 1. Advantageous embodiments of the module for exchanging an interface unit in a testing system are given in the dependent subclaims.

According to the invention, a module for replacing an interface unit in a testing system with a handling unit and a testing unit for testing semiconductor elements is provided. The module has a basis element, which is or can be attached to the testing system, and a drawer unit with a holding frame for accommodating an interface unit. Furthermore, the module comprises guide elements which connect the drawer unit to the basis element and are designed to guide the drawer unit relative to the basis element between an insertion position, in which the drawer unit is located in the testing system between the testing unit and the handling unit, and a removal position, in which the drawer unit is located outside an area between the testing unit and the handling unit for exchanging the interface unit.

The module is characterized in that the basis element has a docking element which comprises a counter-docking unit and is arranged adjacent to the holding frame in the removal position of the drawer unit in such a way that a correspondingly designed docking unit of a trolley for transporting interface units can couple in order to transfer an interface unit to the holding frame or pick it up from it.

The docking element can be attached directly to the basis element, but it can also be attached to the testing system or to both, whereby the docking element comprises a counter-docking unit and is arranged adjacent to the holding frame in the removal position of the drawer unit in such a way that a correspondingly designed docking unit of a trolley for transporting interface units can couple in order to transfer an interface unit to the holding frame or pick it up from it.

When using such a test system, the interface units must be replaced regularly, as different types of semiconductor elements to be tested require correspondingly different interface units. To replace an interface unit in the testing system, the handling unit and the testing unit are separated from each other and moved slightly apart. The drawer unit can then be moved out with the interface unit by means of the guide elements from a retracted position between the handling unit and the testing unit into the removal position. After moving out into the removal position, the interface unit can be replaced.

The drawer unit with the newly inserted interface unit can then be moved back from the removal position to the insertion position using the guide elements.

A trolley may be provided which is designed for transporting (handling) interface units and with which interface units can be automatically exchanged between the drawer unit of the module and a storage device for a plurality of interface units. Such trolleys usually have a handling part for holding an interface unit and a trolley on which the handling part is arranged. The chassis is often an AGV (automated guided vehicle) or an AMR (autonomous mobile robot). Such a trolley can be found, for example, in DE 10 2020 104 641 A1 (U.S. Pat. No. 11,493,554 B2).

The docking element is provided to improve the process of automatically exchanging interface units between such a trolley and the drawer unit of the module.

To replace an interface unit, the drawer unit is in the removal position outside the test system and the docking element is arranged adjacent to the holding frame of the drawer unit in the removal position.

The docking element comprises a counter-docking unit to which a correspondingly designed docking unit of a trolley for transporting interface units can couple. The docking element thus enables a trolley to be docked, whereby the trolley not only has a target point for actuation, but is also securely fixed to the docking element.

The docking element is arranged with respect to the drawer unit in such a way that an interface unit can be safely picked up by the holding frame of the drawer unit or transferred to the holding frame after a trolley has docked. As a result, the drawer unit and the trolley are in a defined position relative to each other during the transfer process of the interface unit, so that the interface unit can be transferred reliably and automatically.

The opposite docking unit can have two opposite docking elements that are spaced apart from one another and are each designed to accommodate a docking element of the docking unit of a trolley.

As a result, the docking unit coupled to the opposite docking unit is precisely aligned in the plane defined by the corresponding opposite docking elements of the opposite docking unit.

The opposite docking elements can be designed in such a way that they align the docking elements towards themselves in the axial direction when the docking elements are picked up.

The axial direction is the direction in which the docking elements and the opposite docking elements are moved in relation to each other during the coupling or docking process. Aligning the docking elements with the opposite docking elements in the axial direction means that the position and orientation of the docking elements in space is clearly defined in relation to the opposite docking elements or opposite docking unit.

The opposite docking elements can be designed in such a way that they retract the docking elements in the axial direction to a predetermined end position when the docking elements are picked up.

As a result, the trolley can initially be coupled to the opposite docking unit with a certain amount of play with the docking unit, whereby the docking unit and the opposite docking unit then pull together essentially without play, whereby the docking elements of the docking unit are positioned exactly in relation to the opposite docking elements of the opposite docking unit. It is therefore sufficient to first roughly position the trolley, whereby the fine positioning is then carried out by pulling the docking elements and the opposite docking elements together.

The docking element can be designed as a docking arm, whereby the drawer unit is arranged in a horizontal position in the removal position and the docking arm extends over the drawer unit in such a way that an interface unit in the holding frame is freely accessible.

There are basically two variants of test systems. A horizontal testing system, in which the interface unit is arranged horizontally with its interface level between the testing unit and the handling unit, and a vertical testing system, in which the handling unit and the testing unit are arranged next to each other and the connecting sides that are in contact are aligned vertically. Accordingly, an interface unit that is located between the handling unit and the testing unit must be arranged with its interface plane vertical in a vertical testing system.

If the drawer unit is in a horizontal position in the removal position, this is normally a position of the drawer unit for a horizontal testing system. This means that the drawer unit does not have to be rotated when moving from the removal position to the insertion position.

In a vertical testing system with a vertical interface level, it is useful if the trolley is designed with a rotatable support arm for carrying an interface unit, so that the interface unit can be swiveled to a vertical position and transferred to a vertically aligned drawer unit.

In principle, however, it is also possible to rotate the drawer unit, whereby it can be moved from a horizontal removal position to a vertical insertion position in order to be used for a vertical testing system. However, as the installation space between the two units of a test system is very limited, it is preferable for the rotating mechanism to be formed on the trolley.

By freely accessible is meant that a reception aperture of the holding frame, in which an interface unit can be held, is freely accessible. This means that the docking arm does not cover an area of the reception aperture of the holding frame in such a way that an interface unit can be picked up or transferred directly perpendicular to the reception aperture.

An interface unit can be picked up from the holding frame or transferred from it to the holding frame by means of a trolley coupled to the docking arm.

The docking arm is arranged on the testing system or extending over the drawer unit in such a way that an interface unit can be picked up from or transferred to the holding frame by the trolley coupled to the docking arm directly perpendicular to the reception aperture of the holding frame. No horizontal displacement of the interface unit is necessary. Thus, a mechanism of the trolley with which an interface unit is gripped and lifted or lowered and released can be simply designed, since only a movement perpendicular to the reception aperture of the holding frame is necessary.

The docking arm can have a holding arm that is designed to hold the drawer unit in the removal position against the force of gravity.

A support surface can be provided on the holding arm, on which the drawer unit rests after it has been moved into the removal position.

Thanks to the holding arm, the docking arm thus serves on the one hand as a coupling device for a trolley and at the same time as a holding aid for the drawer unit. This means that even heavy interface units can be safely picked up by the supported drawer unit and, in particular, safely carried by the trolley during transfer until the trolley has moved away again and the drawer unit is retracted.

The holding arm ensures even more precise alignment of the drawer unit to the trolley during the transfer of the interface unit.

The docking arm can have a swivel joint so that it can be pivoted on the basis element between a folded-in position and a folded-out position. The docking arm is preferably provided with a locking device with which it can be fixed in the folded-in position and/or folded-out position.

The fold-out position can be a position in which the docking arm is arranged adjacent to the holding frame in the removal position of the drawer unit and the docking unit of a trolley can couple to the counter-docking unit of the docking arm.

The fold-out position of the docking arm is provided when the drawer unit is in the removal position. Preferably, the docking arm is moved into the fold-out position before the drawer unit is moved outwards into the removal position. This allows the drawer unit to be picked up and held by the holding arm of the docking arm when it is extended.

The fold-in position can be a position in which the docking arm is pivoted in a horizontal plane by approximately 90° to the fold-out position and rests against the testing system.

The docking arm is placed in the fold-in position when the drawer unit is in the retracted position in the testing system. Preferably, the docking arm is moved to the fold-in position after the drawer unit has been moved inwards to the retracted position. In this way, the docking arm is in a position in which it does not block any space. This means that the space required by the drawer unit in the removal position or the docking arm in the fold-out position does not have to be kept permanently free. The testing system also requires less free space if it needs to be moved.

The docking element can be arranged on the drawer unit, whereby the drawer unit is arranged in a vertical position in the removal position.

If the drawer unit is in a vertical position in the removal position, this is normally a position of the drawer unit for a vertical testing system. This means that the drawer unit does not have to be rotated when moving from the removal position to the insertion position.

An interface unit can be picked up from the holding frame of the drawer unit, which is in a vertical position, in the removal position by means of a trolley coupled to the docking element, or can be transferred from this to the holding frame.

When the interface unit is transferred, the interface unit can be moved in a vertical position towards the holding frame of the vertically arranged drawer unit. A force directed towards the holding frame may be necessary, which is provided by the trolley, in order to insert the interface unit into the holding frame.

When picking up the interface unit from the holding frame of the vertically arranged drawer unit, a force directed away from the holding frame may be necessary to bring the interface unit out of the holding frame. This force can be provided by the trolley.

The module comprising the drawer unit, the guide elements, the basis element and the docking element can be designed as an independent unit.

The module can therefore be retrofitted to or removed from an existing testing system.

Furthermore, the module can be rectangular or square in a plan view. This means that the module can be arranged on the testing system in four orientations, each rotated by 90°. If the testing system is a system that requires an interface plane parallel to the horizontal, then the module can be arranged in four 90° rotated orientations, whereby the module can be rotated about an axis perpendicular to the interface plane.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

Further tasks, features and advantages of the present invention are apparent from the description and the exemplary embodiment shown in the accompanying figures. These show in.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Also, all conjunctions used are to be understood in the most inclusive sense possible. Thus, the word "or" should be understood as having the definition of a logical "or" rather than that of a logical "exclusive or" unless the context clearly necessitates otherwise. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following, a testing system 1 with a module 2 according to an embodiment of the invention is explained in more detail (FIGS. 2 to 5).

The invention is explained below with reference to a test system 1 for semiconductor components, but is also applicable to test systems for wafers.

Figure 1:
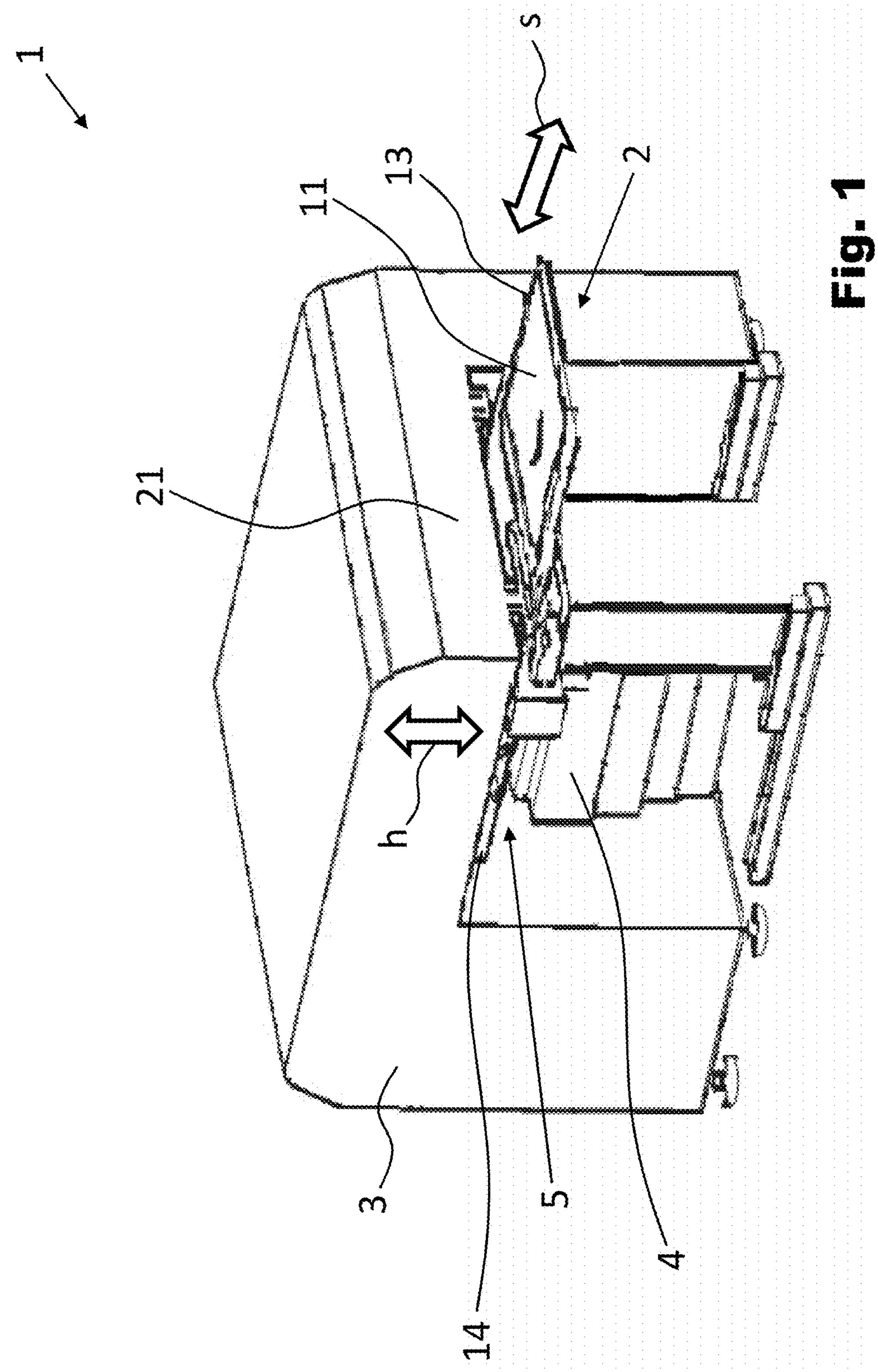
FIG. 1A schematic representation of a test system with a module for replacing an interface unit in a perspective view, FIG. 2A schematic representation of a section of a module with a drawer unit in a retracted position on a testing system and with a docking arm in a folded position, FIG. 3A schematic representation of the module with the drawer unit in the retracted position on the testing system shown in FIG. 2 and with the docking arm in a folded-out position, FIG. 4A schematic representation of the module with the drawer unit in a removal position on the testing system according to FIG. 2 and with the docking arm in the fold-out position, and FIG. 5A schematic representation of the module with the drawer unit in the removal position on the testing system according to FIG. 2, with the docking arm in the fold-out position and with a coupled trolley.
Figure 2:
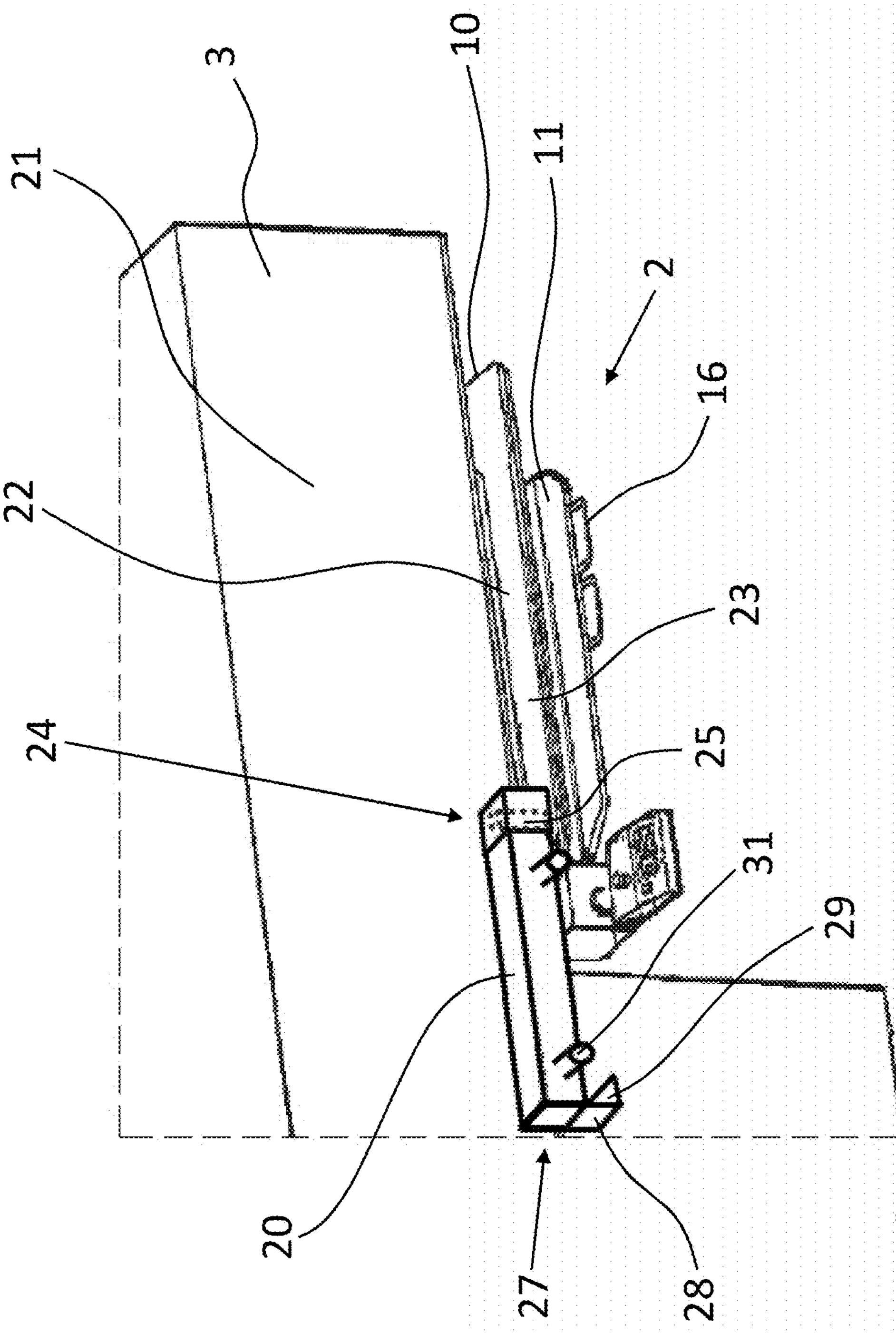
Figure 3:
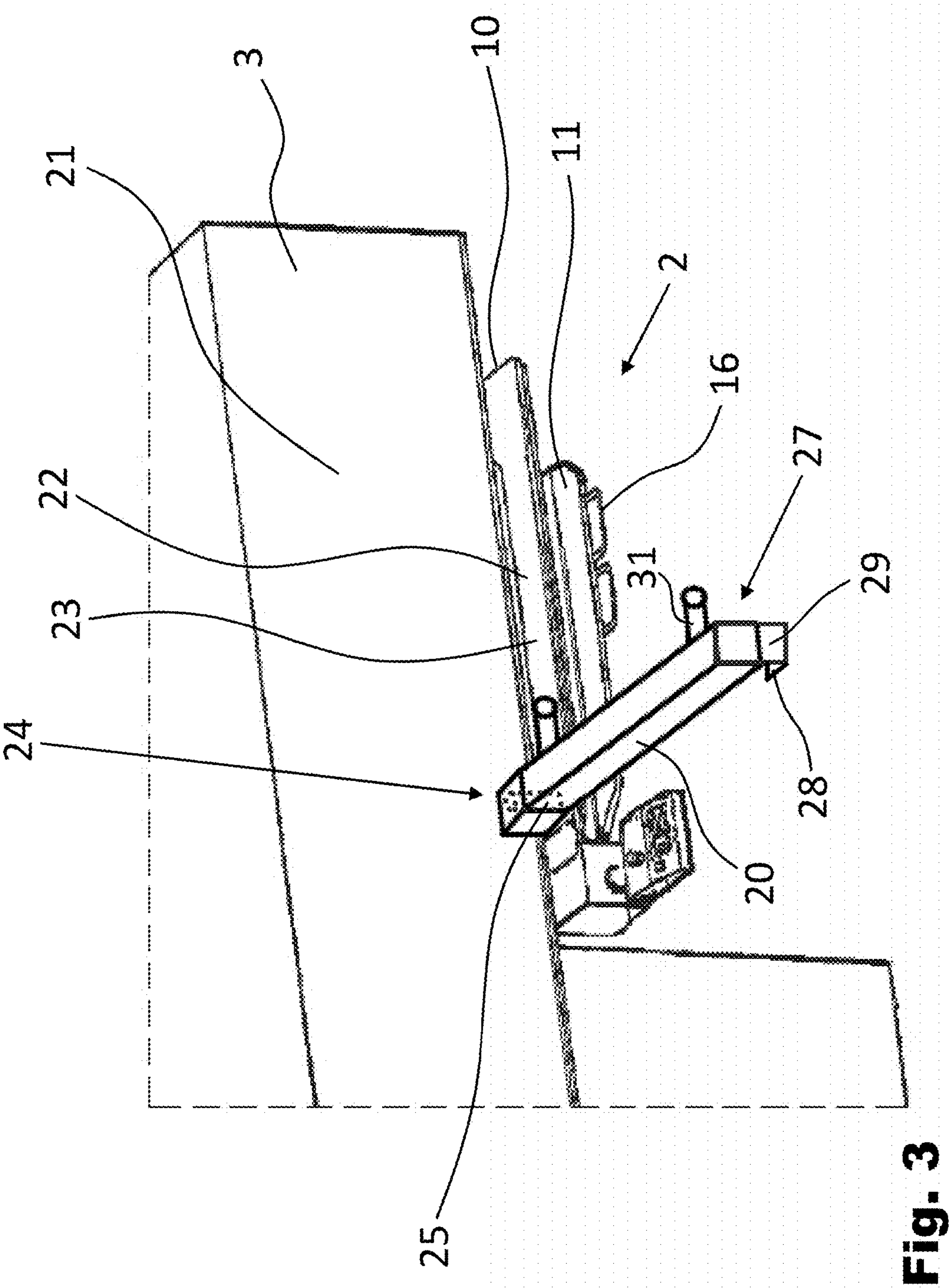

When the terms "front" and "rear" or "right" and "left" are used in the following in relation to the testing system 1, the module 2 or its components, these specifications are chosen from the viewing direction of an operator of the testing system 1, unless otherwise defined in individual cases, as such a testing system 1 generally has one side from which an operator has access to the testing system 1. In FIGS. 1 to 3, this side is located approximately at the bottom right.

The testing system 1 has a handling unit 3 and a testing unit 4. In operation, the handling unit 3 is a fixed unit, below which the testing unit 4 is arranged. More precisely, the testing unit 4 can be moved into an area 5 left free in the lower area of the handling unit 3 and coupled to the handling unit 3. The module 2 for exchanging an interface unit 6 is arranged between the handling unit 3 and the testing unit 4.

In operation, the handling unit 3 is used to feed semiconductor components to the interface unit 6. The semiconductor components held on the interface unit 6 are then tested by the testing unit 4. The test can take a few seconds or up to several minutes.

Both the handling unit 3 and the testing unit 4 are approximately box-shaped and have horizontal surfaces between which the module 2 is located, which is thus arranged horizontally. This testing system 1 is therefore referred to as a horizontal testing system.

The interface unit 6 is usually made up of several parts. For example, the interface unit 6 has a base frame 7, a contacting board (interface board) 8 and a stiffener 9.

The module 2 has a basis element 10, which is attached to the testing system 1 during operation. In the present embodiment example, the basis element 10 is attached to the handling unit 3.

The module 2 also has a drawer unit 11 with a holding frame 12, wherein the holding frame 12 is designed to hold the interface unit 6. The drawer unit 11 is movable with respect to the basis element 10 by means of guide elements.

The guide elements comprise a drawer mechanism 13 for translational, i.e. linear, guidance of the drawer unit 11 in a thrust direction s, and a lifting mechanism 14 for translational, i.e. linear, guidance of the drawer unit 11 in a lifting direction h (FIG. 1).

In the thrust direction s, the drawer unit 11 can be guided between an insertion position, in which the drawer unit 11 is located in the testing system 1 between the testing unit 4 and the handling unit 3, and a removal position, in which the drawer unit 11 is located outside the area 5 between the testing unit 4 and the handling unit 3 for replacing the interface unit 6.

In the lifting direction h, the drawer unit 11 can be guided between the retracted position and an end position. The end position is a position in which the drawer unit 11 with the interface unit 6 is pressed against the basis element 10.

For testing by the testing unit 4, the testing unit 4 and the handling unit 3 must be brought together so that the interface unit 6 is fixed between the handling unit 3 and the testing unit 4. In this position, the drawer unit 11 holds the interface unit 6 in relation to the handling unit 3 so that the latter can load the interface unit 6 with semiconductor components. This position is therefore referred to as the test position.

The removal position is a position in which the drawer unit 11 holds the interface unit 6 ready for an operator outside the area 5, so that the operator could in principle easily remove the interface unit 6.

The thrust direction s runs along an interface plane, and the lifting direction h runs perpendicular or at least essentially perpendicular to the interface plane and thus perpendicular to the thrust direction s.

In a horizontal testing system, the interface plane extends horizontally and is a plane containing the interface unit 6 in use. The interface plane can be defined by a surface or other characteristic plane of the contacting board 8 or a support surface or other characteristic plane of the stiffener 9 or a common support plane of receiving elements of the base frame 7 of the interface unit 6.

Suitable design measures ensure that the lifting mechanism 14 can only be actuated when the drawer mechanism 13 is in the retracted position. Furthermore, devices are provided to ensure that the drawer mechanism 13 can only be actuated when the lifting mechanism 14 is in the retracted position.

The basis element 10 is a rigid, frame-shaped body that can be made of aluminum or steel, for example, or possibly fiber-reinforced plastic.

The drawer unit 11 is also a rigid, frame-shaped body with the holding frame 12, which can be made of aluminum or steel, for example, or optionally of fiber-reinforced plastic and which in the present case is formed in one piece, for example from a plate, but alternatively can also be constructed in several parts, for example from several struts. The holding frame 12 forms a reception aperture 15, in which the interface unit 6 can be received and thus forms a reception aperture for the interface unit 6. One or more handles 16 for manually moving the drawer unit 11 in the thrust direction s may be provided on a front frame side of the holding frame 12.

The drawer mechanism 13 has a pair of guide rails 17 and a pair of running rails 18. In each case, a guide rail 17 and a running rail 18 form a telescope rail 19. The running rails 18 run in the guide rails 17 and hold the holding frame 12 between them. As described, the drawer mechanism 13 can be operated manually by means of the handles 16. Alternatively, the drawer mechanism 13 can also be actuated by a motor, for example by an electromotive, electromagnetic, pneumatic or hydraulic or other type of drive.

The lifting mechanism 14 has a pair of universal joints consisting of a first and a second lever arm (not shown), each extending between the basis element 10 and one of the running rails 18. The universal joint can be folded or unfolded like a pair of scissors, which is why it can also be referred to as a scissor mechanism. When the universal joint is opened and closed, the telescope rail 19 with the drawer unit 11 is raised or lowered with respect to the basis element 10. Here, the telescope rail 19 is always arranged parallel to the surface of the basis element 10. The lever arms can be moved relative to each other by any suitable means. These can be manually actuated by an actuating lever mechanism or motor-actuated, for example by an electromotive, electromagnetic, pneumatic or hydraulic or other type of drive. In detail, the drawer mechanism 13 and the lifting mechanism 14, in particular the design, position and arrangement of swivel joints, the course of guide track(s) and the design of the swivel levers and their modifications, can follow the description and illustration in DE 10 2012 103 893 A1, to the disclosure of which reference is made in full, also with regard to the design of the drawer unit and the sequence of movements when the interface unit is replaced.

According to the invention, a docking element is provided on the basis element 10. In the present embodiment example, the docking element is a docking arm 20.

The docking arm 20 is an elongated cuboid body with four sides. The docking arm 20 has a stable design and can be made of aluminum or steel, for example, or possibly of fiber-reinforced plastic.

For this purpose, the basis element 10, which is attached to the handling unit 3, protrudes slightly beyond the handling unit 3 at a front face 21 of the handling unit 3.

A first end 24 of the docking arm 20 is attached to this protrusion 22 of the basis element 10 on a top side 23 of the basis element 10.

At the first end 24, the docking arm 20 has a swivel joint 25 with which the docking arm 20 can be folded out and in parallel to the interface plane. In a folded-in position, the docking arm 20 rests on the protrusion 22 of the basis element 10 and is in close contact with the handling unit 3. In the folded-in position, the docking arm 20 does not obstruct any space.

In the following, the docking arm 20 is explained further using the docking arm 20 in a fold-out position. For this purpose, the drawer unit 11 is assumed to be in the removal position. In the fold-out position, the docking arm 20 extends above the drawer unit 11, which is in the removal position.

The docking arm 20 extends perpendicular to the front face 21 of the handling unit 3 and parallel to the interface plane into an area outside the test system 1. The docking arm 20 extends laterally beyond the holding frame 12 of the drawer unit 11 in such a way that the reception aperture 15 of the holding frame 12 for receiving an interface unit 6 is not covered by the docking arm 20. The reception aperture 15 is free and still easily accessible.

Figure 4:
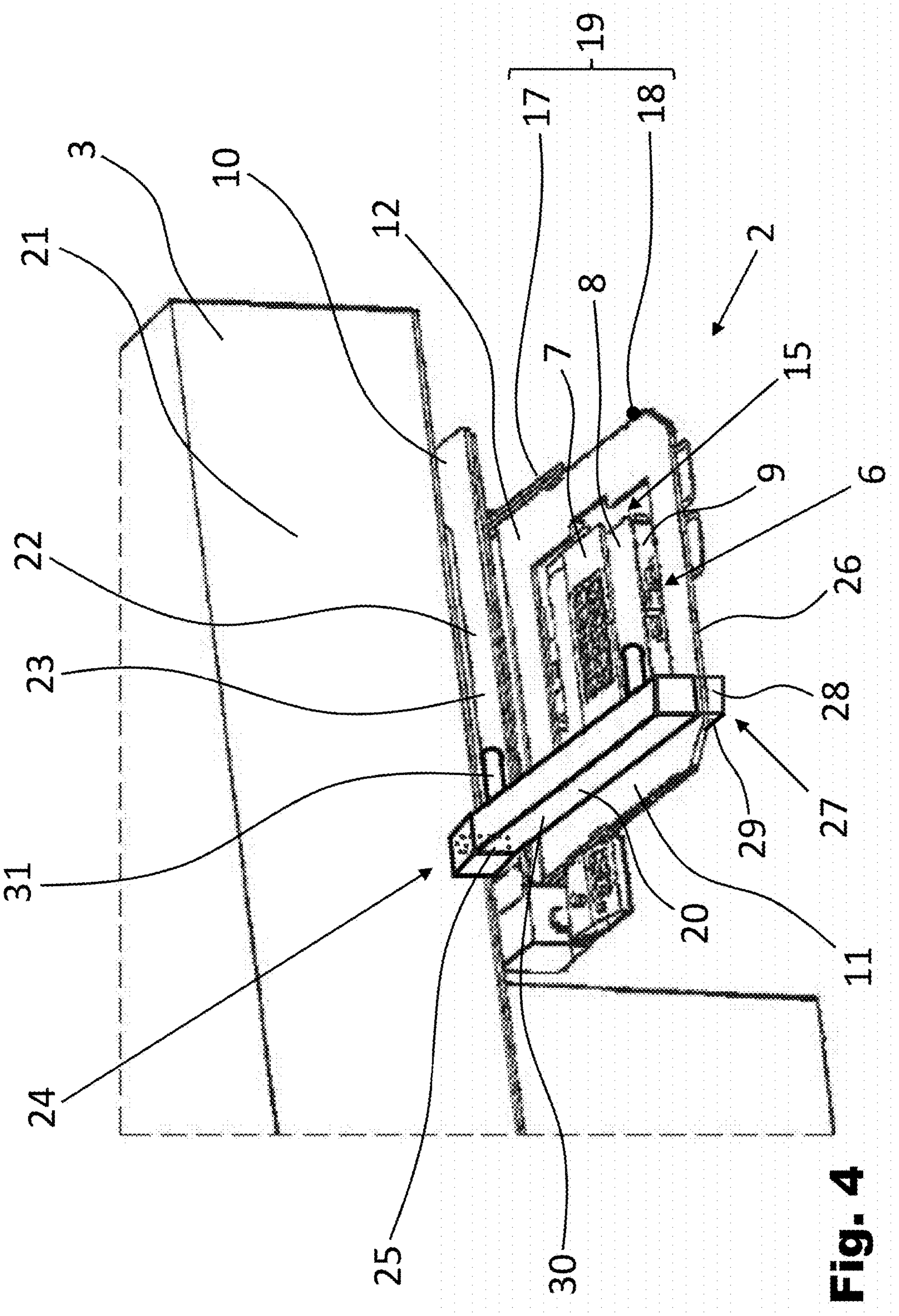
Figure 5:
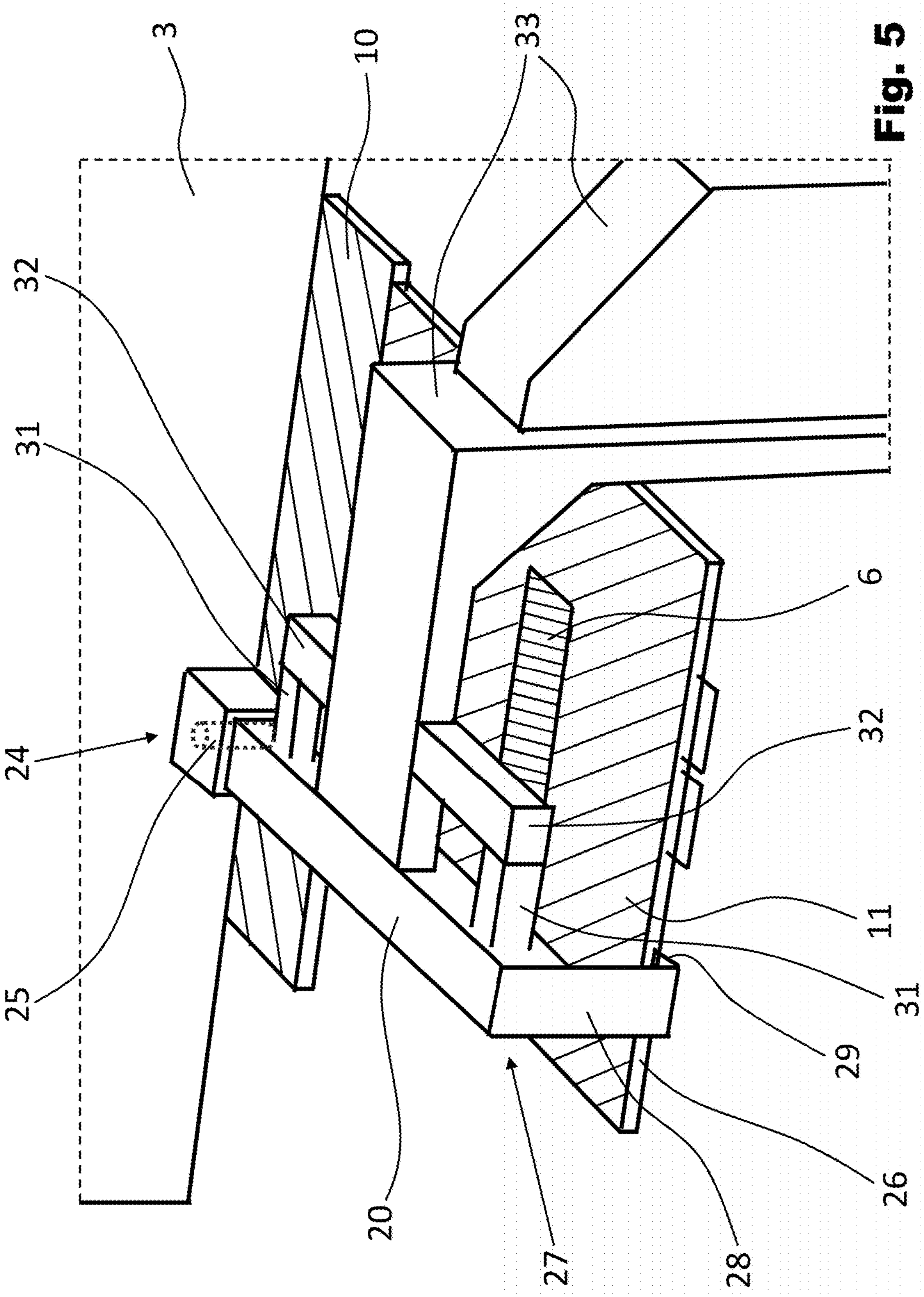

The docking arm 20 has a length that corresponds approximately to a distance from the basis element 10 to an edge 26 of the drawer unit 11 opposite the handling unit 3 (FIG. 4).

At a second end 27 located adjacent to the edge 26 of the drawer unit 11, the docking arm 20 has a holding arm 28 projecting vertically downwards in the direction of the drawer unit 11.

The holding arm 28 has a length such that it passes the edge 26 of the drawer unit 11. In the area of the edge 26, a small support surface 29 extending in the direction of the handling unit 3 is provided on the holding arm 28.

The support surface 29 is designed so that the drawer unit 11 can rest on the support surface 29 in the area of the edge 26 of the drawer unit 11. In this way, the drawer unit 11 is held against gravity by the support arm 29 at its end remote from the handling unit 3.

Two opposite docking elements 31 are provided on a side 30 of the docking arm 20 pointing towards the interface unit 6. The opposite docking elements 31 are each arranged adjacent to one of the ends 24, 27 of the docking arm 20.

The opposite docking elements 31 together form a counter-docking unit. The opposite docking elements 31 are designed to receive corresponding docking elements 32 of a docking unit.

The counter-docking unit is used to couple a trolley 33, which transports (handles) interface units 6 and can exchange them with the testing system 1. Such trolleys 33 are described in patent application DE 10 2022 129 458.7, to the disclosure of which reference is also made in full in this respect.

By means of the opposite docking elements 31 and the docking elements 32 of a trolley 33, such a trolley 33 can couple to the docking arm 20 in the fold-out position. Since the reception aperture 15 for the interface unit 6 is accessible in this state, an interface unit 6 can be easily inserted or removed by means of the trolley 33 after coupling.

The docking arm 20 thus serves on the one hand as a holding device for the drawer unit 11 and at the same time as a coupling device for a trolley 33. In this way, even heavy interface units can be safely picked up by the held drawer unit 11 and, in particular, can be safely carried by the trolley 33 during the transfer until the trolley 33 has moved away again and the drawer unit 11 is retracted.

From the fold-out position, the docking arm 20 is folded in in a direction facing away from a side opposite the side 30.

The opposite docking elements 31 are preferably formed so that the docking elements and the opposite docking elements can engage with each other with a considerable amount of play (e.g. 5 mm horizontal and/or vertical deviation), and then contract to a position which has a precision in the horizontal and vertical directions of a few 0.1 mm. The opposite docking elements 31 and the docking elements are preferably designed such that, in the contracted state, the docking elements of the trolley are also aligned in the plane parallel to the extended drawer unit. Such opposite docking elements and docking elements can be found, for example, in DE 10 2021 114 564 A1 (US 2022/390508 A1).

The opposite docking element and the docking element can be pulled together automatically or manually.

Docking with the trolley is preferably automatic, as is the transfer of the interface unit from or to the trolley.

The module for exchanging an interface unit can also be designed to move automatically between the removal position and the end position, so that the entire transfer of the interface unit as well as moving into the end position or moving out of the end position and transfer to the trolley can take place fully automatically.

The invention has been explained above with reference to an embodiment example in which the docking element or the docking arm on the module is designed to replace an interface unit. This is also very advantageous, as the module and the docking element form a unit that can be attached to the testing system. As it is a structural unit, the docking element and the other elements of the module are precisely aligned with each other in terms of location or space.

Within the scope of the invention, however, it is also possible to form the docking element separately from the module and to attach it separately to the testing system. In this case, the docking element must be aligned with the module in a certain spatial relationship so that the transfer can take place properly.

LIST OF REFERENCE SYMBOLS

1 Testing system
2 Module

3 Handling unit
4 Testing unit
5 free area
6 Interface unit
7 Base frame
8 Contact plate (interface board)
9 Stiffener
10 Basis element
11 Drawer unit
12 Holding frame
13 Drawer mechanism
14 Lifting mechanism
15 Reception aperture
16 Handle
17 Guide rail
18 Rail
19 Telescopic rail
20 Docking arm
21 Front side
22 Protrusion
23 Top side
24 First end
25 Swivel joint
26 Edge
27 Second end
28 Holding arm
29 Support surface
30 Side
31 Opposite docking element
32 Docking element
33 Trolley
s Thrust direction
h Lifting direction While this invention has been particularly shown and described with references to preferred embodiments thereof, it will be understood by those skilled in the art that various changes in form and details may be made therein without departing from the scope of the invention encompassed by the appended claims.

What is claimed is:

1. A module for replacing an interface unit in a testing system with a handling unit and a testing unit for testing semiconductor elements, the module comprising:

a basis element which is or can be attached to the testing system, a drawer unit with a holding frame for accommodating an interface unit, and guide elements which connect the drawer unit to the basis element and are designed to guide the drawer unit relative to the basis element between a retracted position, in which the drawer unit is located in the testing system between the testing unit and the handling unit, and a removal position, in which the drawer unit is located outside an area between the testing unit and the handling unit for replacing the interface unit, wherein the basis element has a docking element which comprises a counter-docking unit and is arranged adjacent to the holding frame in the removal position of the drawer unit in such a way that a correspondingly designed docking unit of a trolley for transporting interface units can couple in order to transfer an interface unit to the holding frame or pick it up from the latter.

2. The module according to claim 1, wherein the opposite docking unit has two opposite docking elements which are spaced apart from one another and are each designed to receive a docking element of the docking unit of a trolley.

3. The module according to claim 2, wherein the opposite docking elements are designed in such a way that they align the docking elements in an axial direction towards themselves when the docking elements are received.

4. The module according to claim 2, wherein the opposite docking elements are designed in such a way that they retract the docking elements in the axial direction to a predetermined end position when the docking elements are received.

5. The module according to claim 1, wherein the docking element is designed as a docking arm, the drawer unit being arranged in a horizontal position in the removal position and the docking arm extending beyond the drawer unit in such a way that an interface unit in the holding frame is freely accessible.

6. The module according to claim 5, wherein an interface unit can be picked up by the holding frame or transferred from it to the holding frame by means of a trolley coupled to the docking arm.

7. The module according to claim 5, wherein the docking arm has a holding arm which is designed to hold the drawer unit in the removal position against the force of gravity.

8. The module according to claim 5, wherein the docking arm on the basis element can be folded into a fold-in position or folded out into a fold-out position.

9. The module according to claim 8, wherein the fold-out position is a position in which the docking arm is arranged adjacent to the holding frame in the removal position of the drawer unit and the docking unit of a trolley can couple to the counter-docking unit of the docking arm.

10. The module according to claim 8, wherein the fold-in position is a position in which the docking arm is pivoted in a horizontal plane by approximately 90° to the fold-out position.

11. The module according to claim 1, wherein the docking element is arranged on the drawer unit, the drawer unit being arranged in a vertical position in the removal position.

12. The module according to claim 11, wherein an interface unit can be picked up from the holding frame of the drawer unit, which is in a vertical position, in the removal position by means of a trolley coupled to the docking element, or can be transferred from the latter into the holding frame.

13. A testing system for testing semiconductor elements comprising a testing unit and a handling unit, wherein the testing system comprises:

a module for exchanging an interface unit, the module having:

a basis element which is or can be attached to the testing system, a drawer unit with a holding frame for accommodating an interface unit, and guide elements which connect the drawer unit to the basis element and are designed to guide the drawer unit relative to the basis element between a retracted position, in which the drawer unit is located in the testing system between the testing unit and the handling unit, and a removal position, in which the drawer unit is located outside an area between the testing unit and the handling unit for replacing the interface unit, wherein the basis element has a docking element which comprises a counter-docking unit and is arranged adjacent to the holding frame in the removal position of the drawer unit in such a way that a correspondingly designed docking unit of a trolley for transporting interface units can couple in order to transfer an interface unit to the holding frame or pick it up from the latter.

14. The system for exchanging an interface unit comprising a testing system according to claim 13 and a trolley having docking elements for coupling to the opposite docking elements of the testing system.

15. The system according to claim 14, wherein the system is designed for the fully automatic transfer of an interface unit between the trolley and the testing system.

* * * * *